(12) United States Patent
Lin et al.

(10) Patent No.: US 6,222,220 B1
(45) Date of Patent: *Apr. 24, 2001

(54) EXTENDED TRENCH FOR PREVENTING INTERACTION BETWEEN COMPONENTS OF STACKED CAPACITORS

(75) Inventors: Chenting Lin, Poughkeepsie; Andreas Knorr, Fishkill, both of NY (US)

(73) Assignee: Siemens Aktiengesellschaft, Munich (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/209,198

(22) Filed: Dec. 10, 1998

(51) Int. Cl.⁷ .................................................. H01L 31/119
(52) U.S. Cl. ........................ 257/306; 257/310; 257/303; 438/240
(58) Field of Search ..................... 257/306, 303, 257/310, 311; 438/240, 239

(56) References Cited

U.S. PATENT DOCUMENTS

| | | | |
|---|---|---|---|
| 5,381,302 | * 1/1995 | Sandhu et al. | 361/305 |
| 5,392,189 | * 2/1995 | Fazan et al. | 361/305 |
| 5,654,567 | 8/1997 | Numata et al. | 257/306 |
| 5,760,434 | * 6/1998 | Zahurak et al. | 257/309 |
| 5,915,189 | * 6/1999 | Sim | 438/397 |
| 5,952,687 | * 9/1999 | Kawakubo et al. | 257/296 |

FOREIGN PATENT DOCUMENTS

| | | |
|---|---|---|
| 0 847 083 | 6/1998 | (EP) . |
| 10-173154 | 6/1998 | (JP) . |

OTHER PUBLICATIONS

European Search Report dated May 24, 2000.

* cited by examiner

*Primary Examiner*—Tom Thomas
*Assistant Examiner*—Douglas W. Owens
(74) *Attorney, Agent, or Firm*—Donald B. Paschburg

(57) ABSTRACT

A stacked capacitor, in accordance with the present invention includes a conductive plug disposed within a trench for connecting to an access device. A barrier is formed on the plug and is disposed within the trench. A dielectric layer is formed over the trench, the dielectric layer forming a hole therethrough exposing at least a portion of the barrier. A first electrode is formed within the hole and extends from the hole. A capacitor dielectric layer is formed on the first electrode and separating the first electrode from a second electrode, and the dielectric layer and the first electrode substantially prevent chemical interactions between materials of the barrier and materials of the capacitor dielectric layer and an oxidizing environment used to form the capacitor dielectric layer. A method of fabrication is also included.

13 Claims, 7 Drawing Sheets

EXTENDED TRENCH FOR PREVENTING INTERACTION BETWEEN COMPONENTS OF STACKED CAPACITORS

BACKGROUND

1. Technical Field

This disclosure relates to semiconductor fabrication and more particularly, to an extended trench for decreasing interactions between a barrier layer and a high dielectric constant material used in stack capacitor fabrication for semiconductor memories.

2. Description of the Related Art

Semiconductor memory cells include capacitors accessed by transistors to store data. Data is stored by as a high or low bit depending on the state of the capacitor. The capacitor's charge or lack of charge indicates a high or low when accessed to read data, and the capacitor is charged or discharged to write data thereto.

Stacked capacitors are among the types of capacitors used in semiconductor memories. Stacked capacitors are typically located on top of the transistor used to access a storage node of the capacitor as opposed to trench capacitors which are buried in the substrate of the device.

In semiconductor memories, such as dynamic random access memories (DRAM), high dielectric constant capacitor formation processes include deposition of highly dielectric materials. In one type of high dielectric constant capacitors, a layer of high dielectric constant materials, such as barium strontium titanium oxide (BSTO), is deposited in an oxidizing atmosphere.

Referring to FIG. 1, a structure 2 with stacked capacitors is shown. Stacked capacitor 3 includes two electrodes a top electrode or storage node 4, usually platinum (Pt) and a bottom electrode 12 separated by a dielectric layer 18. An access transistor 5 includes a gate 6 which when activated electrically couples a bitline 7 through a bitline contact 8 to a plug 14. Plug 14 connects to electrode 12 through a diffusion barrier 16 which stores charge in electrode 12.

Electrode 12 is separated from plug 14 by diffusion barrier 16. Plug 14 is preferably polycrystalline silicon (polysilicon or poly). During processing, dielectric layer 18 is deposited on electrode 12. Dielectric layer 18 is typically a material with a high dielectric constant, for example BSTO. Diffusion barrier 16 is employed to prevent the formation of an oxide layer between electrode 12 and diffusion barrier 16.

Material properties between dielectric layer 18 and barrier 16 are degraded if materials of the respective layers interact. Further, dielectric layer 18 (BSTO) reacts with diffusion barrier 16 if the compounds in each layer come into contact. Given the proximity of the two materials in the conventional design shown in FIG. 1, there is an increased likelihood for this reaction to occur and degrade the properties of stacked capacitor 3.

Therefore, a need exists for improving capacitance of stacked capacitors by sealing off a barrier to prevent degradation of a high dielectric constant layer and the barrier layer as a result of processing and diffusion. A further need exists for a method of increasing the capacitance of the stacked capacitors by increasing surface area of a bottom electrode.

SUMMARY OF THE INVENTION

A stacked capacitor, in accordance with the present invention includes a conductive plug disposed within a trench for connecting to an access device. A barrier is formed on the plug and is disposed within the trench. A dielectric layer is formed over the trench, the dielectric layer forming a hole therethrough exposing at least a portion of the barrier. A first electrode is formed within the hole and extends from the hole. A capacitor dielectric layer is formed on the first electrode and separating the first electrode from a second electrode, and the dielectric layer and the first electrode substantially prevent chemical interactions of an oxidizing environment employed when forming the capacitor dielectric layer with materials of the barrier.

Another stacked capacitor for semiconductor memories, in accordance with present invention, includes a conductive plug disposed within a trench for connecting to an access transistor. A barrier is formed on the plug and is disposed within the trench. A dielectric layer is formed over the trench, the dielectric layer forming a hole therethrough exposing at least a portion of the barrier. A first electrode is formed within the hole and extends from the hole, the first electrode being formed from a conductive material such that upon depositing the conductive material a contour forms in an upper surface of the conductive layer wherein the contour provides a surface area for a top surface of the first electrode which exceeds a surface area of a substantially flat top surface of the first electrode. A capacitor dielectric layer is contoured on the first electrode and separating the first electrode from a second electrode, and the dielectric layer and the first electrode substantially prevent chemical interactions of an oxidizing environment employed when forming the capacitor dielectric layer with materials of the barrier.

In alternate embodiments, the dielectric layer may include a nitride. The capacitor dielectric layer may includes Barium Strontium Titanium Oxide. The hole in the dielectric layer is intentionally or unintentionally misaligned with the trench such that a portion of the dielectric layer extends over the barrier and a portion of the first electrode extends beyond a trench side wall. The first electrode preferably includes platinum. The dielectric layer is preferably between about 20 nm and about 250 nm in thickness. The barrier preferably includes at least one of TaN, CoSi, TiN, WSi and TaSiN. The contour of the top surface of the first electrode preferably increases a capacitance of the stacked capacitor by between about 2.5% to about 25% over a first electrode having a flat top surface.

A method for fabricating a stacked capacitor includes the steps of providing a plug and a barrier formed on the plug within a trench, the trench being formed in a first dielectric layer, forming a second dielectric layer on the first dielectric layer and on the barrier layer, patterning a hole in the second dielectric layer to expose at least a portion of the barrier, depositing a conductive layer on the second dielectric layer and in the hole, patterning the conductive layer to form a first electrode, forming a capacitor dielectric layer on the first electrode and forming a second electrode on the capacitor dielectric layer.

In other methods, the step of patterning the hole may include the step of patterning the hole to be misaligned with the trench such that a portion of the dielectric layer extends over the barrier and a portion of the first electrode extends beyond a trench side wall. The step of depositing a conductive layer on the second dielectric layer and in the hole may include the step of forming a contour on a top surface of the conductive layer corresponding to a position of the hole. The step of patterning the conductive layer to form a first electrode may include the step of forming the first electrode including the contour on the top surface. The contour of the top surface of the first electrode preferably increases a capacitance of the stacked capacitor by between about 2.5% to about 25% over a first electrode having a flat top surface. The step of forming a second dielectric layer may include the step of forming the dielectric layer with a thickness between about 20 nm and about 250 nm.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present disclosure relates to stack capacitors for semiconductor devices and more particularly, to an extended trench for decreasing interactions between a barrier layer and an oxidizing environment used to form a high dielectric constant material used in stack capacitor fabrication for semiconductor memories. The extended trench also prevents interactions between the barrier layer and the high dielectric constant material itself. The present invention includes a dielectric layer used to extend a trench which includes a plug and a barrier material. The dielectric layer advantageously seals off the barrier material from a high dielectric material deposited between a top electrode and a bottom electrode of a stack capacitor. By sealing off the barrier from the high dielectric constant material, interaction between these material and the degradation caused by the interactions are prevented. Since the dielectric layer is used to extend the trench, when the bottom electrode is deposited, the bottom electrode includes a contour. The contour increases the surface area of the stacked capacitor thereby increasing the capacitance of the stacked capacitor. The contour which will be described in greater detail herein.

Figure 2:
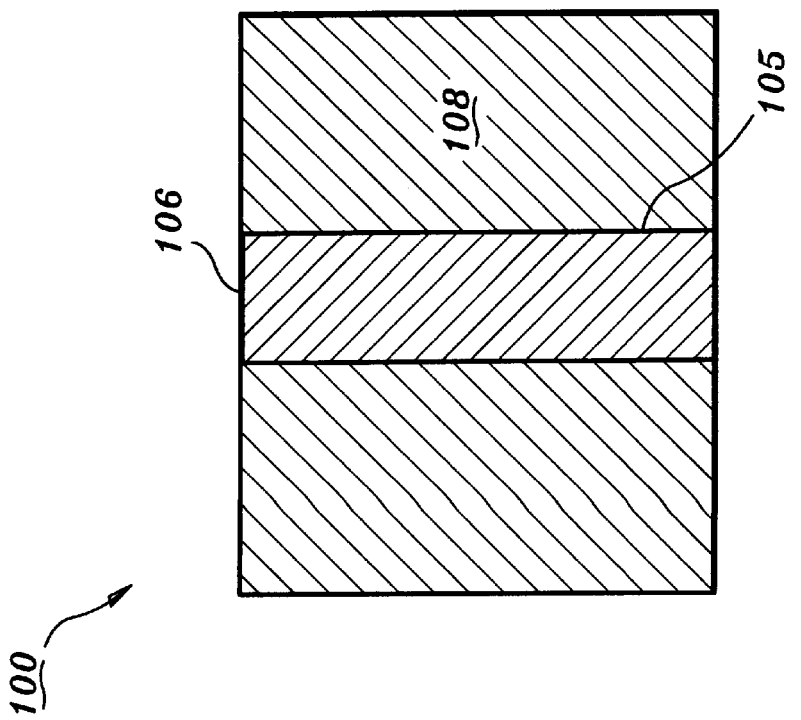
FIG. 2 is a cross-sectional view of a dielectric layer having a trench formed in the dielectric layer and a conductive plug formed in the trench.

Referring now in specific detail to the drawings in which like reference numerals identify similar or identical elements throughout the several views, FIG. 2 shows a stacked capacitor 100 in accordance with one aspect of the present invention. A plug 106 is formed inside a dielectric layer 108 by forming a trench 105 in dielectric layer 108, and depositing a conductive material therein. The top surface is planarized by, for example, a chemical mechanical polish (CMP). Plug 106 preferably includes a polysilicon material, for example a doped polysilicon. Dielectric layer 108 may include an oxide, such as a silicon oxide.

Figure 1:
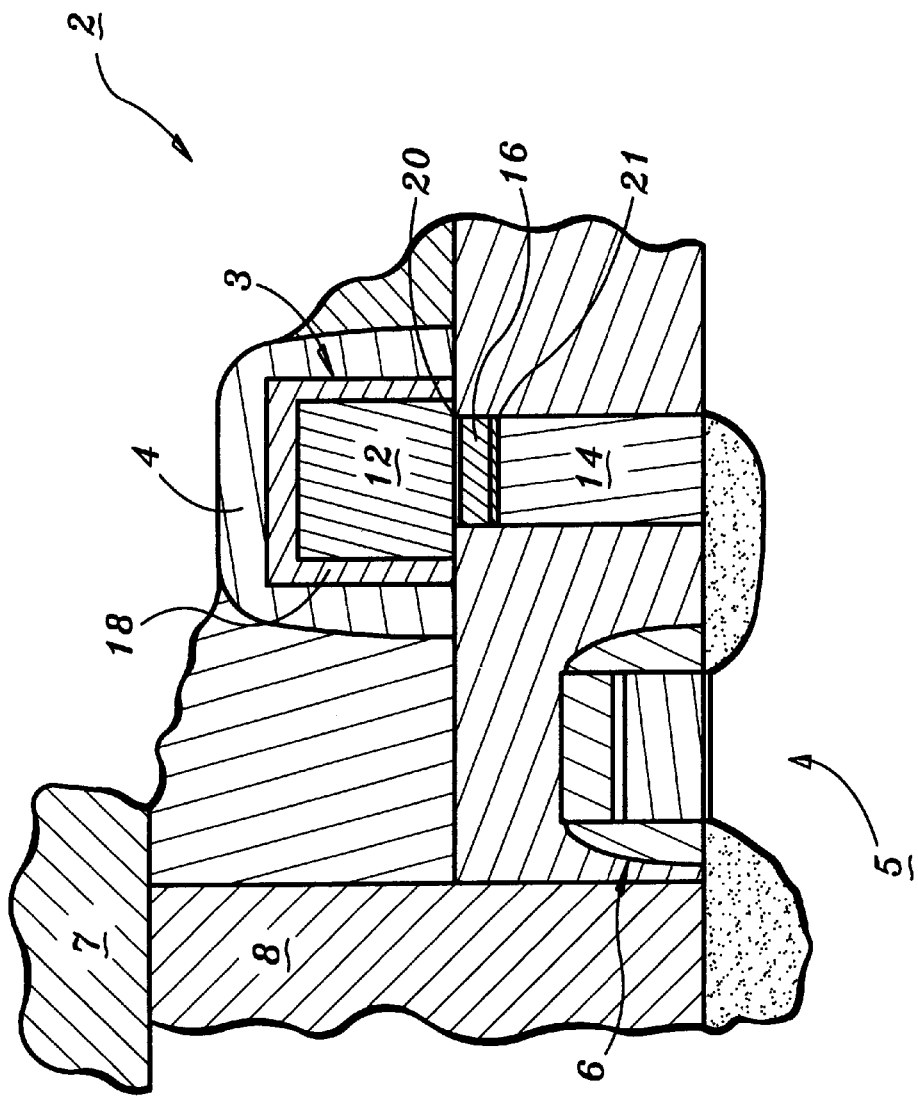
FIG. 1 is a cross-sectional view of a prior art memory cell including a stacked capacitor and an access transistor.
Figure 3:
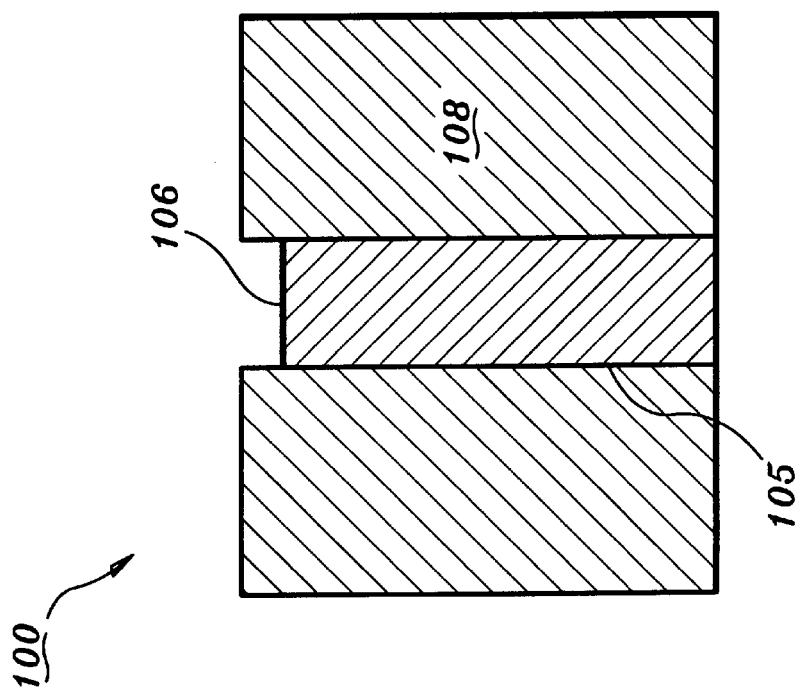
FIG. 3 is a cross-sectional view of the structure of FIG. 2 after recessing the plug.

Referring to FIG. 3, plug 106 is recessed preferably by an etching process. The etching process may include dry etching selective to the material of dielectric layer 108. Plug 106 is recessed a predetermined depth to provide a region for the deposition of a barrier layer in the next steps of the method.

Figure 4:
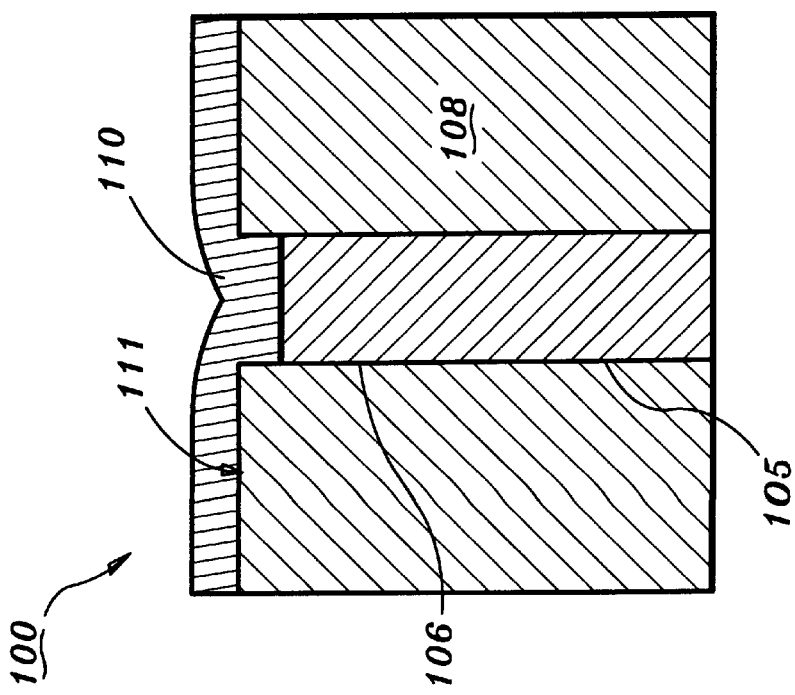
FIG. 4 is a cross-sectional view of the structure of FIG. 3 after a barrier layer is deposited.

Referring to FIG. 4, after recessing plug 106, a diffusion barrier 110 or barrier 110 is formed on a top portion of plug 106 and on a top surface 111 of dielectric layer 108. Diffusion barrier 110 may include TaN, CoSi, TiN, WSi, TaSiN or equivalent materials. Diffusion barrier 110 is deposited by a process or processes known to those skilled in the art. Diffusion barrier 110 aides in preventing diffusion of atoms between a bottom electrode 104 (FIG. 10) and plug 106.

Figure 5:
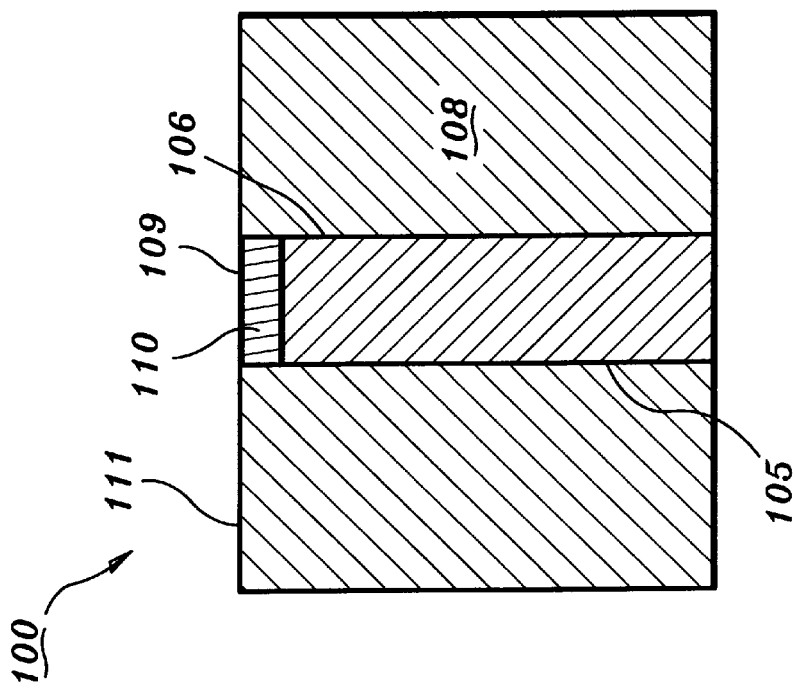
FIG. 5 is a cross-sectional view of the structure of FIG. 4 after recessing planarizing the barrier layer and dielectric layer.

Referring to FIG. 5, material used to form diffusion barrier 110 is removed from top surface 111. In a preferred embodiment, top surface 111 is planarized using a chemical mechanical polishing process. Diffusion barrier 110 remains within trench 105 such that a top surface 109 of diffusion barrier 110 is substantially coplanar with top surface 111 of dielectric layer 108.

Figure 6:
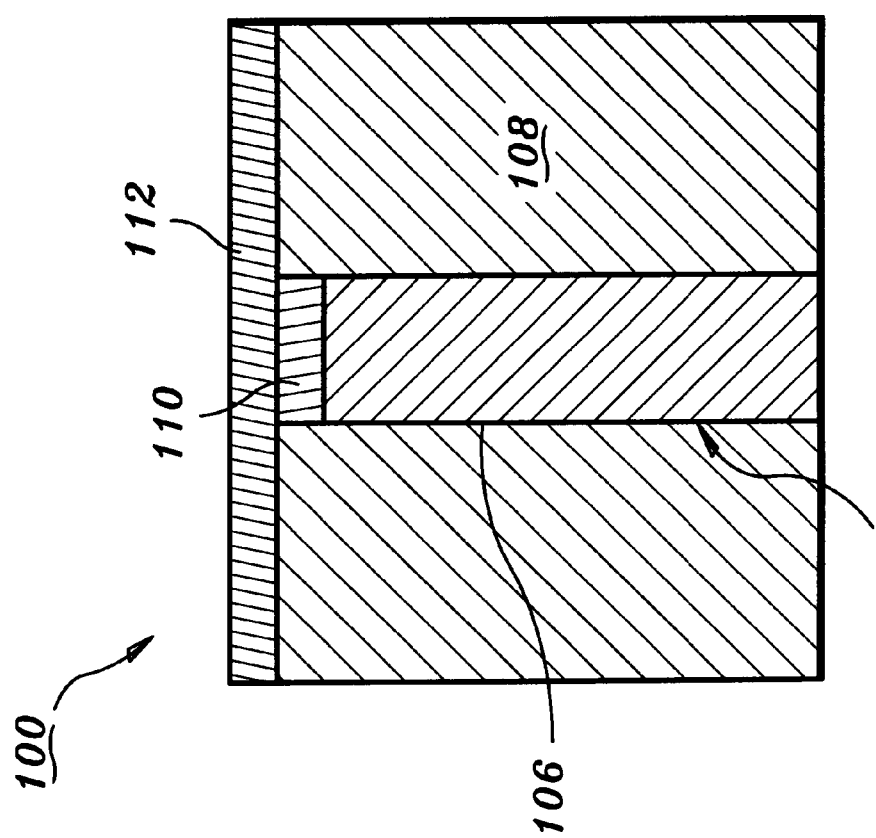
FIG. 6 is a cross-sectional view of the structure of FIG. 5 after depositing an additional dielectric layer thereon in accordance with the present invention.

Referring to FIG. 6, an additional dielectric layer 112 is deposited in accordance with the present invention. Dielectric layer 112 may include an oxide, such as a silicon oxide, a nitride, such as silicon nitride, or a glass, such as borosilicate phosphorous glass (BSPG). Dielectric layer 112 preferably includes silicon dioxide which may be deposited by a chemical vapor deposition process (CVD) or a plasma enhanced CVD (PECVD) process. Dielectric layer 112 preferably includes a thickness between about 20 nm and about 250 nm.

Figure 8:
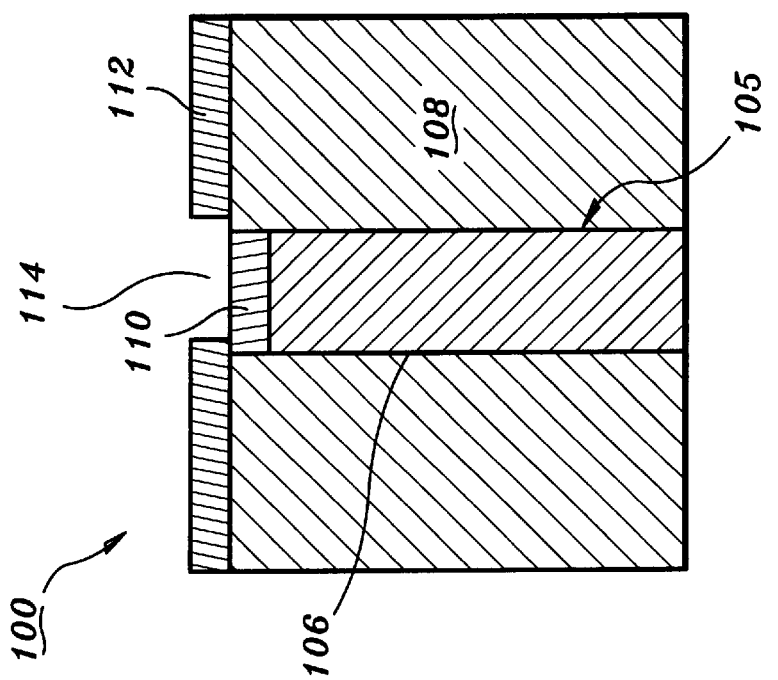
FIG. 8 is a cross-sectional view of the structure of FIG. 7 showing the additional dielectric patterned to be skewed with respect to sidewalls of the trench in accordance with the present invention.
Figure 7:
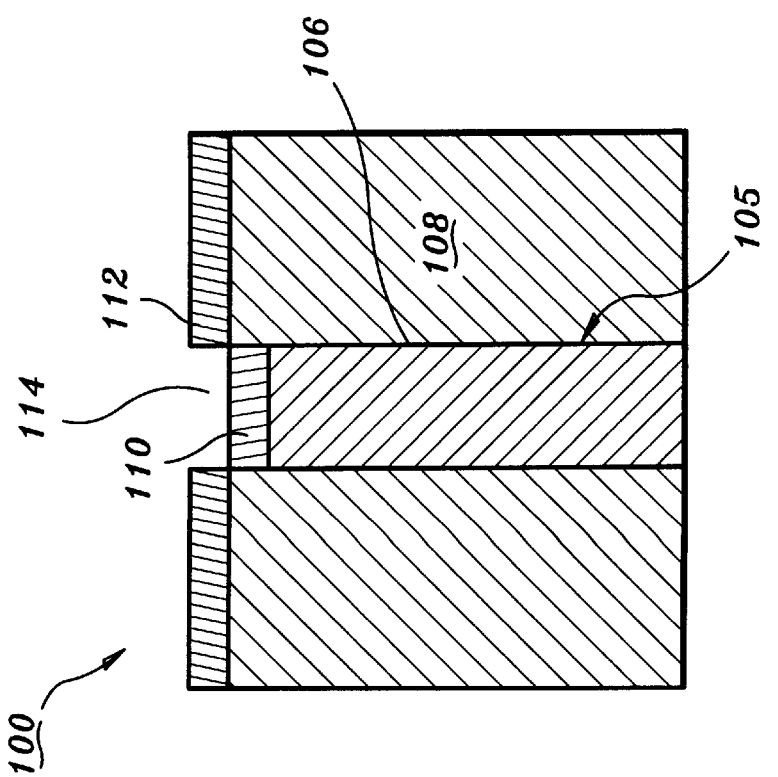
FIG. 7 is a cross-sectional view of the structure of FIG. 6 showing the additional dielectric patterned to coincide with sidewalls of the trench in accordance with the present invention.

Referring to FIGS. 7 and 8, dielectric layer 112 is patterned to extend trench 105. The patterning of dielectric layer 112 is performed by methods known to those skilled in the art, for example by depositing a photoresist material on dielectric layer 112, masking the photoresist in appropriate areas, exposing the photoresist to ultraviolet light and developing the photoresist. The photoresist is then used as an etch mask to form holes 114 in dielectric layer 112. Holes 114 may be aligned with trench 105 walls as shown in FIG. 7, that is hole 114 is the same size as trench 105. However, in a preferred embodiment, holes 114 may be skewed and not concentric with trench 105 as shown in FIG. 8. This skewing of holes 114 of dielectric layer 112 provides an overlap and underlap to increase the tolerance to misalignment. Holes 114 in dielectric layer 112 effectively extend trench 105 in accordance with the present invention.

Figure 9:
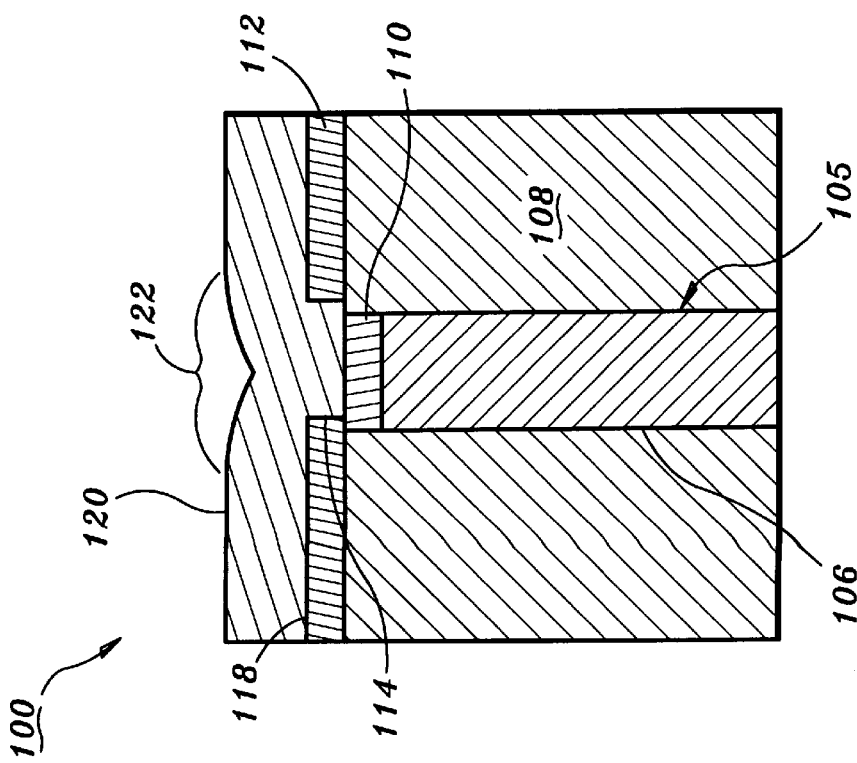
FIG. 9 is a cross-sectional view of the structure of FIG. 8 showing a conductive layer deposited on the structure in accordance with the present invention.

Referring to FIG. 9, a bottom electrode 104 (FIG. 10) is formed on diffusion barrier 110 by depositing a conductive material 120 in hole 114 and on a surface 118 of dielectric layer 112. Conductive material 120 is preferably formed from platinum although other conductive materials such as Iridium (Ir), Ruthenium (Ru) or Ruthenium oxide ($RuO_2$) may be used. Conductive material 120 is preferably deposited by a physical vapor deposition (PVD) process, such as by a sputtering or evaporative deposition process. Conductive material 120 blankets dielectric layer 112 and fill in hole 114. As a result, a contour 122 made from conductive material 120 is formed over hole 114.

Figure 10:
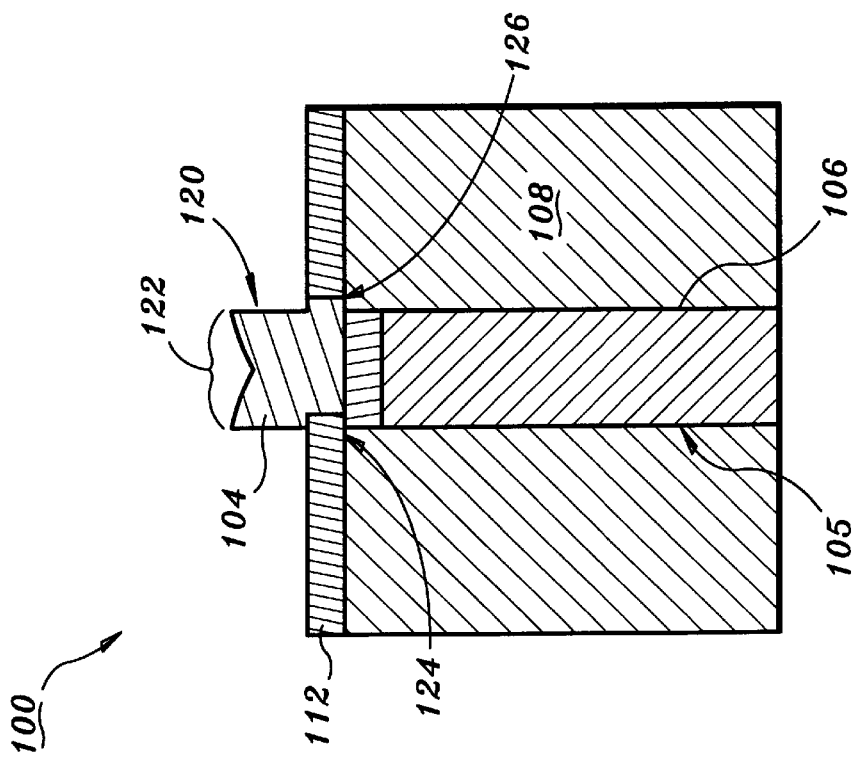
FIG. 10 is a cross-sectional view of the structure of FIG. 9 showing the conductive layer patterned to form a first or bottom electrode having a contoured surface in accordance with the present invention.

Referring to FIG. 10, conductive material 120 is patterned to form electrode 104. The patterning is performed as is known to those skilled in the art for example by photolithography followed by etching. Electrode 104 is preferably concentric or aligned with trench 105. After patterning electrode 104, contour 122 remains on a top surface of electrode 104.

Figure 11:
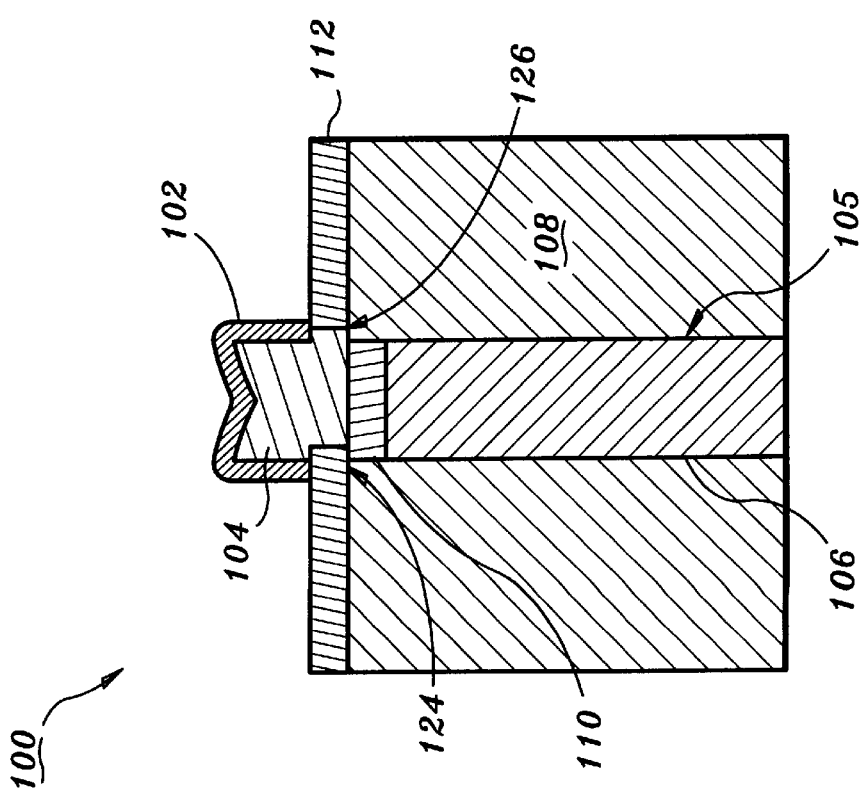
FIG. 11 is a cross-sectional view of the structure of FIG. 10 showing a high dielectric capacitor dielectric layer deposited and patterned on the first electrode in accordance with the present invention.

Referring to FIG. 11, a high dielectric constant layer 102 is deposited and patterned on electrode 104. High dielectric constant layer 102 is preferably formed from barium strontium titanium oxide (BSTO). BSTO is preferably deposited at high temperatures. However, since high temperatures increase diffusion, BSTO deposition temperatures must be limited to reduce the diffusion of materials, such as oxygen. In the present invention however deposition temperatures for layer 102 may advantageously be increased without degrading performance since barrier layer 110 is "sealed off" from high dielectric constant layer 102 by electrode 104. During processing and operation, diffusion of elements from high dielectric constant layer 102, and/or from the oxidizing deposition environment, to barrier layer 110 or vice versa are hindered by dielectric layer 112 and electrode 104. Dielectric layer 112 preferably includes silicon nitride and electrode 104 preferably includes Pt both materials have superior diffusion resistance and therefore reduce diffusion. Further, since the interfaces at first area 124 and second area 126 are skewed, a diffusion path for elements from high dielectric constant layer 102 and/or barrier layer 110 is considerably longer as compared to the prior art.

Figure 12:
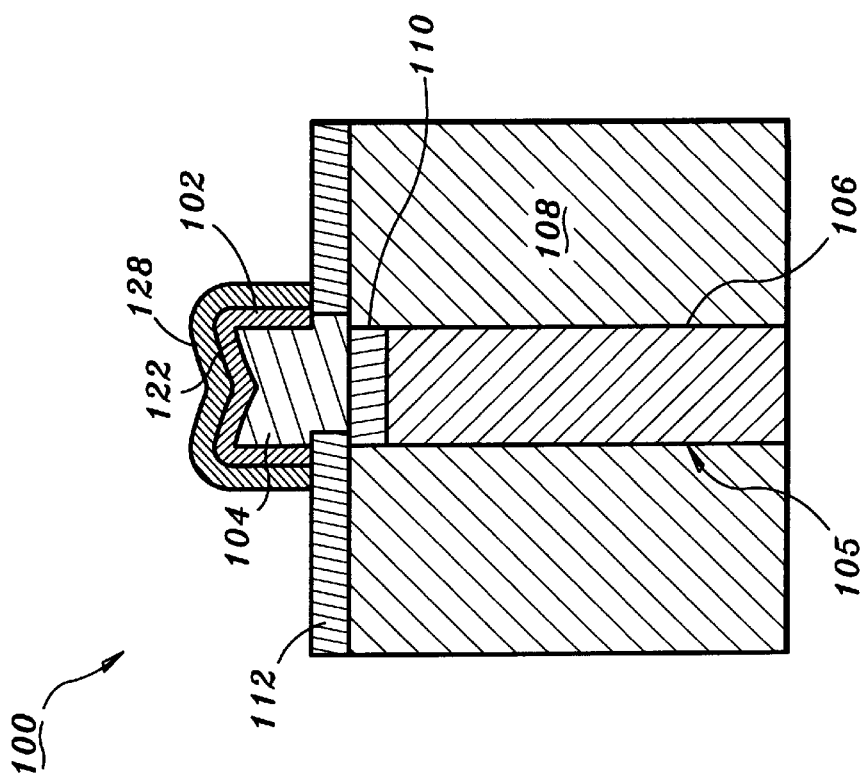
FIG. 12 is a cross-sectional view of the structure of FIG. 11 showing a second electrode or top electrode formed on the high dielectric capacitor dielectric layer in accordance with the present invention.

Referring to FIG. 12, a top electrode 128 is formed on high dielectric constant layer 102. Top electrode 128 and bottom electrode 104 form stacked capacitor 100 in accordance with the present invention. Stacked capacitor 100 advantageously employs contour 122 to increase the surface area of electrodes 104 and 128. This increases the capacitance of the memory device. For example, capacitance may be increased by between about 2.5% to about 25%. Further processing for completing the structure of stacked capacitor 100 proceeds from this point as is known to those of ordinary skill in the art.

Having described preferred embodiments for extended trench for preventing interaction between components of stacked capacitors (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A stacked capacitor comprising:
    a conductive plug disposed within a trench for connecting to an access device;
    a barrier formed on the plug and disposed within the trench;
    a dielectric layer formed over the trench, the dielectric layer forming a hole therethrough exposing at least a portion of the barrier, wherein the hole is misaligned with the trench such that a portion of the dielectric layer extends over the barrier and a portion of the hole extends beyond a trench side wall;
    a first electrode formed within the hole and extending from the hole, an upper portion of the first electrode being substantially concentric with the trench;
    a capacitor dielectric layer formed on the first electrode and separating the first electrode from a second electrode; and
    the dielectric layer and the first electrode for substantially preventing chemical interactions between the capacitor dielectric layer and the barrier.

2. The stacked capacitor as recited in claim 1, wherein the dielectric layer includes a nitride.

3. The stacked capacitor as recited in claim 1, wherein the capacitor dielectric layer includes Barium Strontium Titanium Oxide.

4. The stacked capacitor as recited in claim 1, wherein the first electrode include platinum.

5. The stacked capacitor as recited in claim 1, wherein the dielectric layer is between about 20 nm and about 250 nm in thickness.

6. The stacked capacitor as recited in claim 1, wherein the barrier includes at least one of TaN, CoSi, TiN, WSi and TaSiN.

7. A stacked capacitor for semiconductor memories comprising:
    a conductive plug disposed within a trench for connecting to an access transistor;
    a barrier formed on the plug and disposed within the trench;
    a dielectric layer formed over the trench, the dielectric layer forming a hole therethrough exposing at least a portion of the barrier, wherein the hole is misaligned with the trench such that a portion of the dielectric layer extends over the barrier and a portion of the hole extends beyond a trench side wall;
    a first electrode formed within the hole and extending from the hole, an upper portion of the first electrode being substantially concentric with the trench and being formed from a conductive material such that upon depositing the conductive material a contour forms in an upper surface of the conductive material wherein the contour provides a surface area for a top surface of the first electrode which exceeds a surface area of a substantially flat top surface of the first electrode;
    a capacitor dielectric layer contoured on the first electrode and separating the first electrode from a second electrode; and
    the dielectric layer and the first electrode for substantially preventing chemical interactions between the capacitor dielectric layer and the barrier.

8. The stacked capacitor as recited in claim 7, wherein the dielectric layer includes a nitride.

9. The stacked capacitor as recited in claim 7, wherein the capacitor dielectric layer includes Barium Strontium Titanium Oxide.

10. The stacked capacitor as recited in claim 7, wherein the first electrode include platinum.

11. The stacked capacitor as recited in claim 7, wherein the dielectric layer is between about 20 nm and about 250 nm in thickness.

12. The stacked capacitor as recited in claim 7, wherein the barrier includes at least one of TaN, CoSi, TiN, WSi and TaSiN.

13. The stacked capacitor as recited in claim 7, wherein the contour of the top surface of the first electrode increases a capacitance of the stacked capacitor by between about 2.5% to about 25% over a first electrode having a flat top surface.

* * * * *